United States Patent [19]

Charbonnier

[11] 4,010,384
[45] Mar. 1, 1977

[54] BINARY FREQUENCY DIVIDER FOR MICROWAVES

[75] Inventor: Roger Charbonnier, Meudon, France

[73] Assignee: Ardet Electrique, France

[22] Filed: Aug. 15, 1975

[21] Appl. No.: 605,091

[30] Foreign Application Priority Data

Oct. 29, 1974  France .............................. 74.36047

[52] U.S. Cl. ....................... 307/220 R; 307/225 R; 328/30; 328/39

[51] Int. Cl.² ..................... H03K 21/00; H03K 5/08

[58] Field of Search ................... 307/220 R, 225 R; 328/25, 30, 39, 41

[56] References Cited

UNITED STATES PATENTS 3,398,297   8/1968   Huen ................................ 328/25

Primary Examiner—Stanley D. Miller, Jr.
Attorney, Agent, or Firm—William Anthony Drucker

[57] ABSTRACT

A binary frequency divider comprises a plurality of serially connected trigger circuits each comprising a switching means having first, second and third terminals and control means for connecting the first terminal alternately to the second terminal and to the third terminal; first storage means connecting the first terminal to the earth; second storage means connecting the third terminal to the earth, and an amplifier having a negative gain whose absolute value exceeds unity, said amplifier having an input connected to the third terminal and an output connected to the second terminal. This frequency divider is particularly adapted for use in the micro-wave and very high frequency ranges.

4 Claims, 4 Drawing Figures

BINARY FREQUENCY DIVIDER FOR MICROWAVES

The present invention relates to frequency division by 2n in the microwave and very high frequency range.

Frequency dividers by the ratio 2n comprise a plurality of ratio 2 dividing elements, conventionally called trigger circuits. These trigger circuits are generally based on the original ECCLES-JORDAN circuit and comprise a large number of active elements (a minimum of two for discrete technology and nine for integrated technology). Moreover, their operating speed is limited to a frequency which is well below the characteristic frequency or transition frequency of the active elements (e.g. one-tenth of the latter).

The present invention has for its object a novel type of trigger circuit having a single active element as well as a very high maximum operating frequency.

The trigger circuit according to the invention comprises switching means having first, second and third terminals and control means for connecting the first terminal alternately to the second terminal and to the third terminal; first storage means connecting the first terminal to the earth; second storage means connecting the third terminal to the earth, and an amplifier having a negative gain whose absolute value exceeds unity, said amplifier having an input connected to the third terminal and an output connected to the second terminal.

According to a preferred embodiment, the storage means consist of capacitors and the amplifier is a voltage amplifier.

The invention also has for its object a frequency divider having a plurality of serially connected trigger circuits of the above defined type, the control means of each trigger circuit having an amplifier output; amplifier output each of said trigger circuits being connected to the input of the control means of the following trigger circuit.

The invention will be better understood from the following description and with reference to the accompanying drawings, in which.

Figure 1:
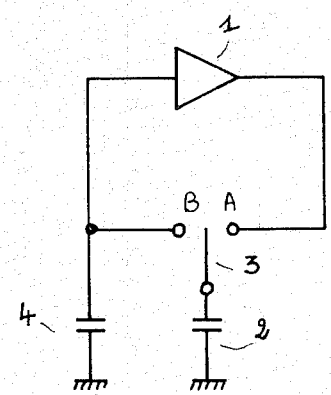
FIG. 1 is a basic circuit diagram of the trigger circuit according to the invention.

In FIG. 1, reference numeral 1 denotes a negative gain amplifier, 2 a first capacitor acting as a storage element, 3 a reversing switch and 4 a second capacitor acting as a storage element.

Control means, not shown, are provided for moving the connecting member 3a so as alternately to connect the first terminal C to the respective second and third terminals A and B of the switch.

When the connecting member is in position A the amplifier output is connected to storage element 2. When the connecting member is in position B, the said storage element 2 is connected to storage element 4 which is itself connected to the amplifier input.

Figure 2:
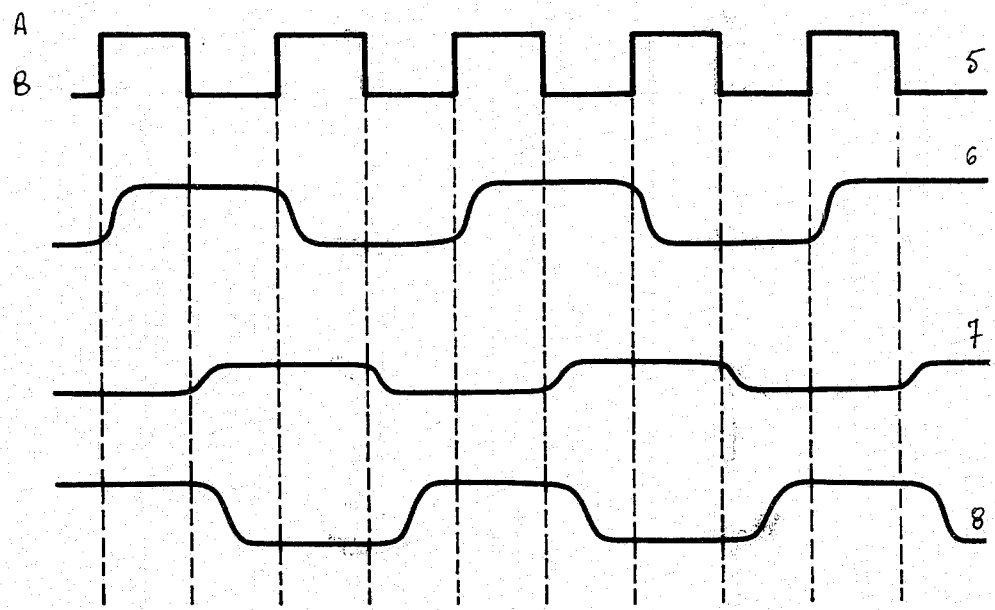
FIG. 2 shows wave forms illustrating the operation.

In FIG. 2, the wave form illustrates the state of the switch over a period of time, 6 the voltage at the terminals of storage element 2, 7 the voltage across storage element 4 and 8 the output voltage of the amplifier.

It can be seen that the device operates by load transfer, as the voltage which represents the load of element 2 is re-copied on element 4 during the passage of the switch into position B, while the output voltage of the amplifier is re-copied on storage element 2 during the passage of the switch into position A. As the load of storage element 2 is distributed between the said storage element and storage element 4, when the switch passes into position B the peak-to-peak amplitude of the amplifier input voltage, shown at 7, is below the amplitude of voltage 6 which is itself substantially equal to the amplitude of voltage 8 at the amplifier output. Thus, it can be readily understood that for the device to operate and for the above voltages to be repeated cyclically, it is necessary that the amplifier gain is negative and its absolute value is above unity.

If, for example, capacitors 2 and 4 have the same value, it is easy to show that the absolute gain value of the amplifier must exceed 3. FIG. 2 also shows that the frequency of the output signals of the amplifier is equal to half the operating frequency of switch 3. Thus the device operates as a frequency divider by the ratio 2.

Figure 3:
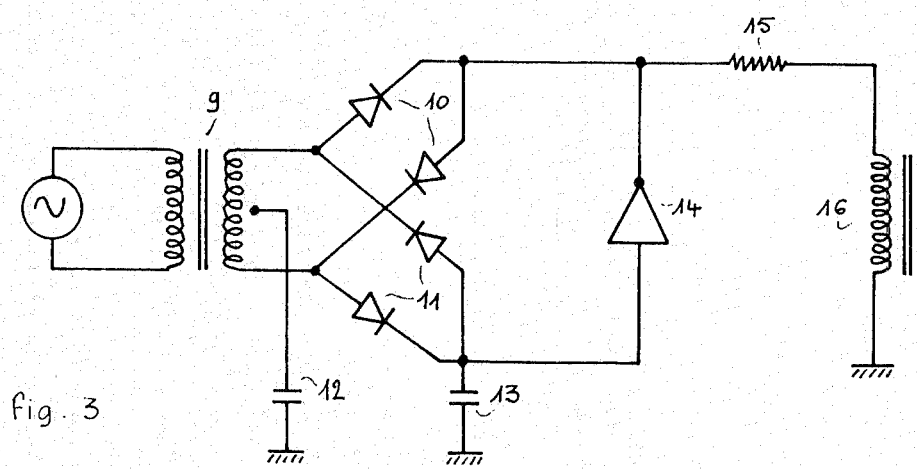
FIG. 3 shows in greater detail a preferred embodiment of the said trigger together with its control means.

FIG. 3 is a complete diagram of a preferred embodiment of a circuit arrangement conforming to the basic diagram of FIG. 1.

Reference numeral 9 denotes a coupling transformer connecting an input control frequency to the switch which is formed by a pair of diodes 10 equivalent to contact A and a pair of diodes 11 equivalent to contact B.

Reference numeral 12 denotes the first store element, 13 the second store element, 14 the negative gain amplifier. The latter may for example comprise a single inverting logic gate, 15 is a coupling resistance connecting the output of the amplifier to the primary winding 16 of a transformer. This transformer may be the input transformer of a following identical stage, thus making it possible to obtain an iterative frequency divider arrangement. The operation of the circuit illustrated in FIG. 3 is that which has been explained hereinabove, with reference to FIGS. 1 and 2. The input control frequency having the wave form illustrated in 5 (FIG. 2), the output frequency has the wave form illustrated in 8 (FIG. 2).

Figure 4:
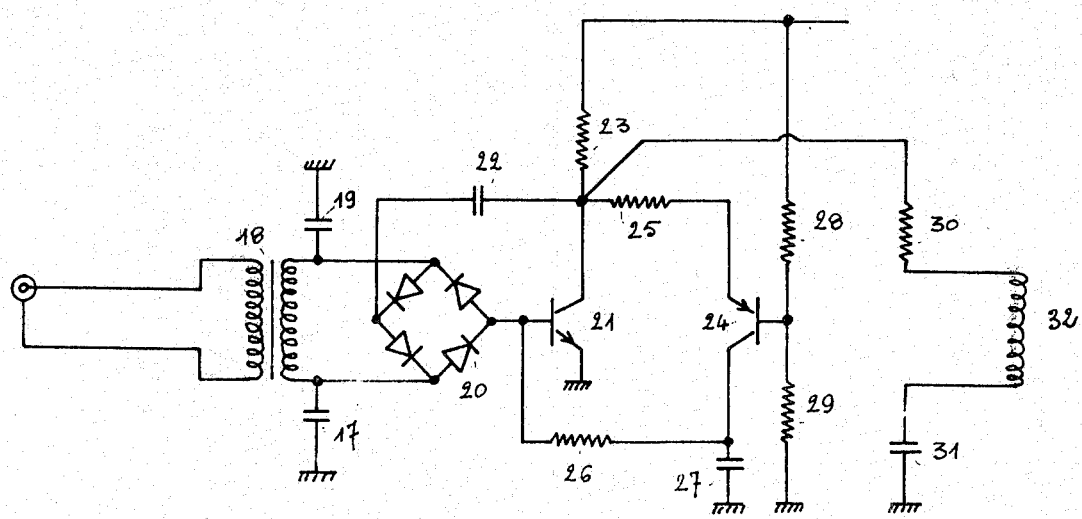
FIG. 4 is a circuit diagram of a modified embodiment.

In the modified embodiment of FIG. 4, 18 is a transformer connecting the input control frequency to the switch, and 17 and 19 are two capacitors which are altogether equivalent to the sole capacitor 2 in FIG. 1. This arrangement avoids the use of a center tapped winding. Reference numeral 20 denotes is a four-diode bridge equivalent to a switch, 21 an npn-transistor with a high limit frequency and 22 a capacitor coupling the collector signal from transistor 21 to the diode bridge. Capacitor 22 should have a sufficiently high capacitance in order that its impedance may be considered as negligible at the operating frequency. Reference numeral 23 denotes the load resistance of transistor 21, 24 is a pnp-transistor which, through cooperation with a resistor 26, a capacitor 27 and a voltage divider consisting of resistors 28, 29, brings about the stabilisation of the mean operating point of transistor 21; 30 is a resistor coupling the output of transistor amplifier 21–24 to the control input of a following identical trigger circuit; 32 is the input transformer of the said following trigger circuit and 31 a by-pass capacitor whose impedance is negligible at the operating frequency.

Obviously if the operating limit frequency of transistor 21 is particularly high and if all the necessary precautions are taken relative to the choice and the locations of the ancillary components thereof, the operating frequency of the arrangement can be very high. In fact the only factors involved in the limitation of the operating frequency are the charging and discharging times of capacitors 17 and 19 and the time lag of transistor 21. In the circuit of FIG. 4 there is no capacitor which fulfils the function of capacitor 4 in FIG. 1. In this case this function is fulfilled by the capacitance of transistor 21 (static capacitance and so-called Miller capacitance).

The circuit of FIG. 4 can operate at input frequencies close to half the limit frequency of the single active component 21. Through the use of components of the microwave type will be possible to operate the basic trigger circuit disclosed at a frequency well above 1 GHz.

It is pointed out that the trigger circuit disclosed hereinabove can only operate in a predetermined input frequency range, its upper limit being determined by stray impedances of the circuit and by the limit frequency of the active component, and its lower range being determined by current leaks (dependent on the quality of the capacitors used as storage means as well as on the fact that the conductance of the control electrode of component 21 is not nil).

Experiments have shown that a trigger device of this type can cover a frequency range in excess of one octave (in practice two or three octaves), and is admirably suited to the binary division of the frequency of microwave oscillators such as yttrium garnet oscillators (so-called Yig oscillators).

We claim:

1. A binary frequency divider including at least one trigger circuit comprising switching means having first, second and third terminals and control means responsive to a periodic control signal, for periodically connecting the first terminal alternately to the second terminal and to the third terminal, an input circuit connected to said control means and providing said control signal; first storage means connecting the first terminal to the earth; second storage means connecting the third terminal to the earth; an amplifier having a negative gain whose absolute value exceeds unity, said amplifier having an input connected to the third terminal and an output connected to the second terminal; and an output circuit connected to the output of the amplifier.

2. A binary frequency divider including at least one trigger circuit comprising a transformer having a primary winding on which an input frequency is applied and a secondary winding having a tapping point and first and second terminals; first capacitance means connecting the tapping point of the secondary winding to the earth; a voltage amplifier having a negative gain whose absolute value is higher than one, said voltage amplifier having an input and an output; a first pair of reversely poled diodes respectively connecting the first and second terminals of the secondary winding to the input of the voltage amplifier; a second pair of reversely poled diodes respectively connecting the first and second terminals of the secondary winding to the output of the voltage amplifier; second capacitance means connecting the input of the amplifier to the earth; and an output circuit connected at the output of the voltage amplifier.

3. A binary frequency divider including at least one trigger circuit comprising a transformer having a primary winding on which an input frequency is applied and a secondary winding having first and second terminals; first capacitance means connecting the first and second terminals of the secondary winding to the earth, a npn transistor having an emitter connected to the earth, a collector and a base, a bridge consisting of four serially connected diodes and having first, second, thrid and fourth terminals, the first and second terminals of the bridge being respectively connected to first and second terminals of the secondary winding and the third terminal of the bridge being connected to the said base; second capacitance means connecting the said collector to the fourth terminal of the bridge and an output circuit connected to said collector.

4. A binary frequency divider as claimed in claim 3, wherein said trigger circuit further comprises a pnp transistor having an emitter, a collector and a base, voltage divider resistance means connecting the collector of the npn transistor to the base of the pnp transistor, a resistor connecting the collector of the npn transistor to the emitter of the pnp transistor; a capacitor having first and second terminals, the said first terminal being connected to the collector of the pnp transistor and the said second terminal being connected to the earth, and a resistor connecting the said first capacitor terminal to the base of the npn transistor.

* * * * *